(12) United States Patent
Huang

(10) Patent No.: US 12,308,285 B2
(45) Date of Patent: *May 20, 2025

(54) METHOD FOR PREPARING FINE METAL LINES WITH HIGH ASPECT RATIO

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 18 days.

This patent is subject to a terminal disclaimer.

(21) Appl. No.: 18/378,889

(22) Filed: Oct. 11, 2023

(65) Prior Publication Data

US 2024/0038585 A1 Feb. 1, 2024

Related U.S. Application Data

(63) Continuation of application No. 17/492,039, filed on Oct. 1, 2021, now Pat. No. 11,837,499.

(51) Int. Cl.
*H01L 21/70* (2006.01)
*H01L 21/311* (2006.01)
*H01L 21/768* (2006.01)

(52) U.S. Cl.
CPC .. *H01L 21/76816* (2013.01); *H01L 21/31144* (2013.01); *H01L 21/7684* (2013.01); *H01L 21/76877* (2013.01)

(58) Field of Classification Search
CPC .......... H01L 21/76877; H01L 21/7684; H01L 21/31144; H01L 21/76816
See application file for complete search history.

(56) References Cited

U.S. PATENT DOCUMENTS 11,837,499 B2 * 12/2023 Huang .............. H01L 21/76816
2019/0355739 A1 * 11/2019 Fang ................. H01L 21/31111

* cited by examiner

*Primary Examiner* — Bradley Smith
(74) *Attorney, Agent, or Firm* — Xuan Zhang

(57) ABSTRACT

The present disclosure provides a method for preparing metal lines with a high aspect ratio including two photolithography stages. According to the design of the method of the present disclosure, first metal lines with high aspect ratio are formed in a dielectric layer, which provides a mechanical support to the first metal lines, thereby preventing the first metal lines from collapsing or deforming. Because of a significant reduction or elimination of collapse or deformation phenomenon in the semiconductor structure, a problem associated with short circuits due to direct contact between the semiconductor components is mitigated, and reliability of the semiconductor structures is enhanced. As a result, a yield of the semiconductor structure is increased.

19 Claims, 11 Drawing Sheets

METHOD FOR PREPARING FINE METAL LINES WITH HIGH ASPECT RATIO

CROSS-REFERENCE TO RELATED APPLICATION

This application is a continuation application of U.S. Non-Provisional application Ser. No. 17/492,039 filed Oct. 1, 2021, which is incorporated herein by reference in its entirety.

TECHNICAL FIELD

The present disclosure relates to a method for preparing a semiconductor structure, and more particularly, to a method for preparing metal lines with high aspect ratio that can undergo two photolithography processes and two etching processes.

DISCUSSION OF THE BACKGROUND

In the application of integrated circuits (ICs), materials such as conductive materials, semiconductor materials and insulating materials have been widely used, and thin film deposition, photolithography and etching are among the semiconductor technologies used in fabrication of ICs. Among these semiconductor technologies, thin film deposition is performed by depositing a layer of one or more the above-mentioned materials on a surface of a wafer, and a photolithography process is performed to copy any desired element patterns or circuit patterns and transfer these patterns to layers on the surface of the wafer through an etching step so as to form semiconductor components such as transistors or capacitors. Since the photolithography process uses a photoresist as a mask to create patterned structures, the robustness of the photoresist is of great importance to pattern definition.

After fabrication of semiconductor components is completed, metal lines must be formed to connect the semiconductor components, a process referred to as a metallization process. In the metallization process, in order to avoid short circuits due to direct contact between the semiconductor components and/or the metal lines, an insulating layer must be formed within and between the semiconductor components and the metal lines to provide isolation. The insulating layer for providing isolation is generally called an inner-layer dielectric layer (ILD) or an inter-metal dielectric layer (IMD). Both the ILD and the IMD can be used in semiconductor components such as transistors and capacitors as a dielectric layer for isolating metal interconnections.

As the size of semiconductor components continues to shrink and the degree of integration of integrated circuits increases, line widths of the metal interconnections and line spaces between the metal lines for connecting various semiconductor components need to be proportionally reduced in accordance with the size of the semiconductor components. When a wire width is reduced, the operating speed of a chip is no longer limited by an operating speed of the component, but the operating speed depends on a transmission speed of an electronic signal along the wires. However, when defining metal lines by photolithography, if resolution is increased in order to reduce the line width and the line space, a thickness of a photoresist layer which acts as a mask must be reduced. Such thickness reduction will limit an increase in the integration of the ICs. In addition, a performance of a semiconductor structure depends on whether or not a CD of the metal line in nano-scale feature can be implemented in the semiconductor structures. A variable to determine the CD of the metal line in the related art mainly depends on performance of a photolithographic apparatus. There exists a serious problem in the related art wherein the CD of the metal line depends to a large degree on the performance of the photolithographic apparatus.

If a hard mask is used in fabrication of the metal lines, a gap aspect ratio between the metal lines will be increased. When depositing an insulating layer (e.g., silicon dioxide or other dielectric materials) by physical vapor deposition (PVD) or chemical vapor deposition (CVD) to fill a gap for isolating the metal lines, voids can be easily formed in the gap. In particular, in the related art, if a second interlayer insulating layer is deposited after the forming of the metal line, there is another drawback, in that a void occurs in the second interlayer insulating layer. Formation of voids will result in poor insulation and reduce reliability of the semiconductor components.

Deep trenches are typically high aspect ratio trenches. The "aspect ratio" is the ratio of a depth of a trench compared to a width of an opening at a top of the trench. Nowadays, an aspect ratio of at least 20:1 or greater has become common in advanced semiconductor manufacturing. By way of example, high aspect ratio trenches in advanced semiconductor manufacturing may have an aspect ratio of between 20:1 and 60:1 or greater. As aspect ratios increase, manufacture of semiconductor structures encounters a problem of collapsing or deformation of the semiconductor structures with high aspect ratios.

Accordingly, there remains a need for a method by which the collapse or deformation of high aspect ratio features on a semiconductor structure can be reduced or eliminated so that the reliability of semiconductor structures can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

To meet the foregoing need, in accordance with the purpose of the present disclosure, a method for preparing fine metal lines with high aspect ratio is provided. The method can be generally characterized as comprising the following steps: providing a substrate including a pattern-dense area and a pattern-loose area adjacent to the pattern-dense area with a dielectric layer covering the pattern-dense area and the pattern-loose area; forming a first hard mask pattern over the dielectric layer to define a dense pattern in the dielectric layer covering the pattern-dense area and a loose pattern in the dielectric layer covering the pattern-loose area; performing a first dielectric etching to form first metal line trenches in the dielectric layer; filling the first metal line trenches with a first metal to form first metal lines in the pattern-dense area and the pattern-loose area followed by performing chemical-mechanical polishing (CMP) to remove the first metal over the dielectric layer; forming a second hard mask pattern over the dielectric layer to cover the first metal lines; performing a second dielectric etching to form second metal line trenches between the first metal lines in the pattern-dense area; and filling the second metal line trenches with a second metal to form second metal lines followed by performing CMP to remove the second metal over the dielectric layer.

Due to the design of the method of the present disclosure, which includes two photolithography stages, the first metal lines with high aspect ratio are formed in the dielectric layer, so that the dielectric layer provides a mechanical support to the first metal lines with high aspect ratio, thereby preventing the first metal lines with high aspect ratio from collapsing or deforming. Because of a significant reduction or elimination of collapse or deformation phenomena in the semiconductor structure, the problem associated with short circuits due to direct contact between the semiconductors components can be mitigated, and reliability of the semiconductor structures can be enhanced. As a result, a yield of the semiconductor structures is increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
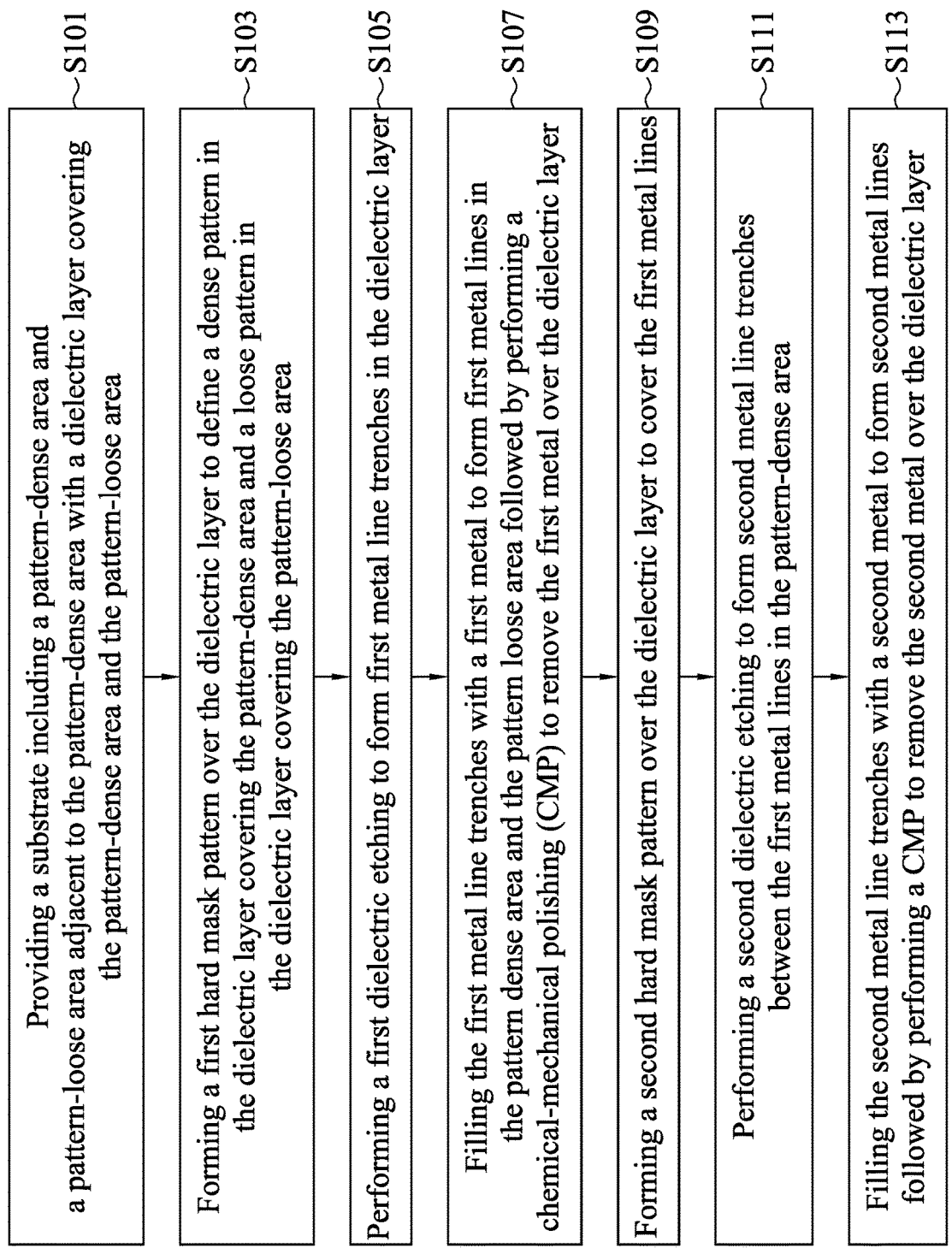
FIG. 1 is a flowchart of a method for preparing fine metal lines in accordance with some embodiments of the present disclosure.

Details shown herein are by way of example and for purposes of illustrative discussion of preferred embodiments of the present invention only and are presented for a purpose of providing what is believed to be a most useful and readily understood description of principles and conceptual aspects of various embodiments of the invention. In this regard, no attempt is made to show structural details of the invention in more detail than is necessary for a fundamental understanding of the invention, and the description taken with the drawings and/or examples should make apparent to those skilled in the art how several forms of the invention may be embodied in practice. Thus, before the disclosed processes and devices are described, it should be understood that aspects described herein are not limited to specific embodiments, apparatuses, or configurations, and as such can, of course, vary. It also should be understood that terminology used herein is for a purpose of describing particular aspects only and, unless specifically defined herein, is not intended to be limiting.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the terms "a," "an," "the" and similar referents used in the context of describing the invention (especially in the context of the following claims) are to be construed to cover both the singular and the plural, unless otherwise indicated herein or clearly indicated by context. Unless the context clearly requires otherwise, throughout the description and the claims, the words "comprises," "comprising," and the like are to be construed in an inclusive sense as opposed to an exclusive or exhaustive sense; that is to say, the terms "comprises" and "comprising," when used in this specification, point out the presence of stated features, integers, steps, operations, elements, or components, but do not preclude the presence or addition of one or more other features, integers, steps, operations, elements, components, or groups thereof.

Groupings of alternative elements or embodiments of the invention disclosed herein are not to be construed as limitations. Each member of a group may be referred to and claimed individually or in any combination with other members of the group or other elements found herein. It is anticipated that one or more members of a group may be included in, or deleted from, a group for reasons of convenience and/or patentability.

Further, spatially relative terms, such as "beneath," "below," "lower," "above," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etching or other removal process. The mask can be a photoresist or a hard mask. In some embodiments, a patterning process is adopted to form a patterned layer directly on a surface. The patterning process includes forming a photosensitive film on the surface, conducting a photolithography process and performing a developing process. The remaining photosensitive film is retained and integrated into the semiconductor device.

The present disclosure will be described in detail with reference to the accompanying drawings with numbered elements. It should be noted that the drawings are in greatly simplified form and are not drawn to scale. Moreover, dimensions have been exaggerated in order to provide a clear illustration and understanding of the present invention.

The method for preparing fine metal lines of the present disclosure will be explained in detail below along with drawings. FIG. 1 is a flow diagram of a method 100 for forming fine metal lines of the present disclosure, and FIGS. 2 to 10 are cross-sectional views showing a semiconductor structure 200 after steps of the process are performed in accordance with some embodiments of the present disclosure.

Figure 2:
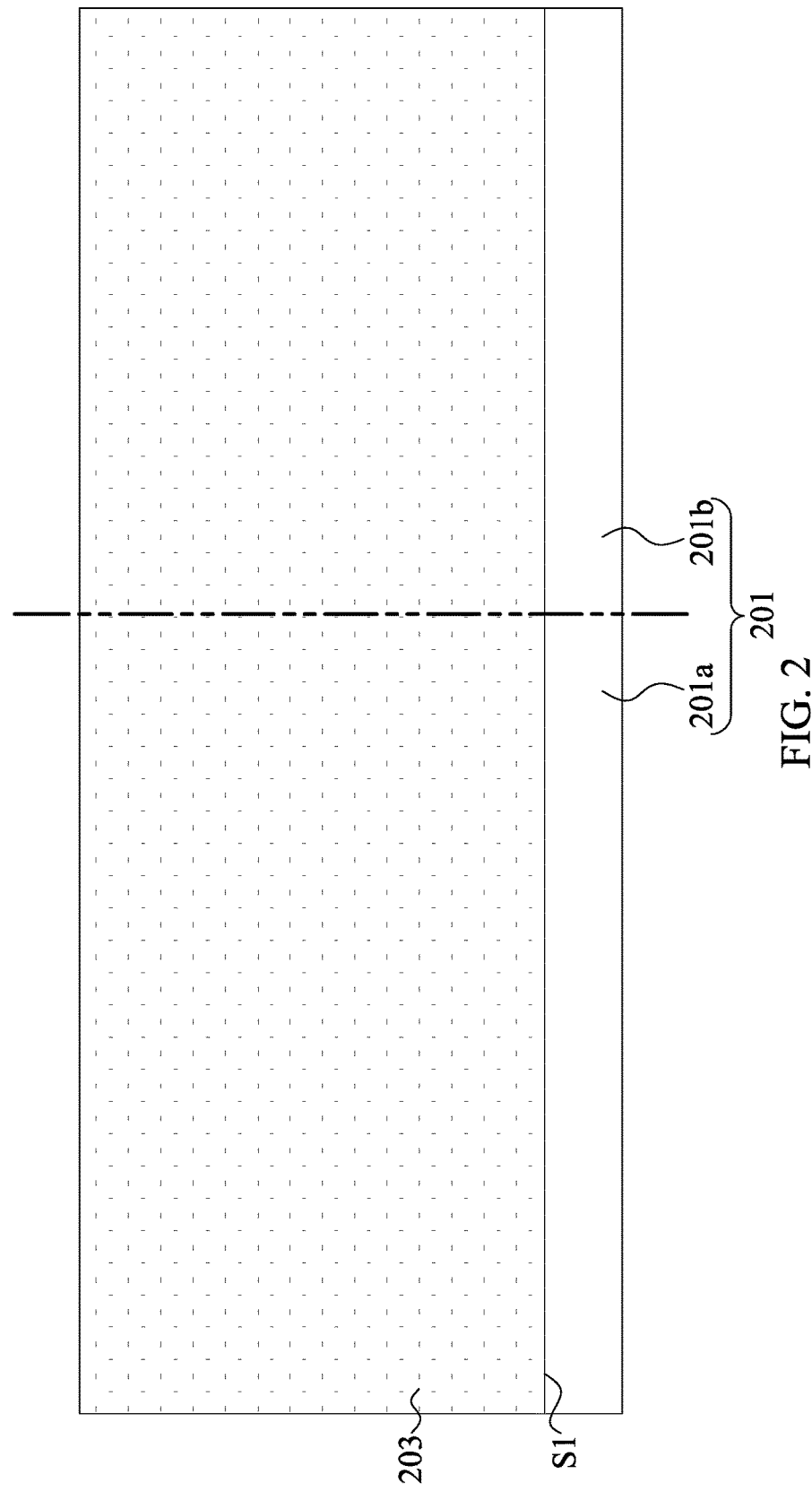
FIG. 2 is a cross-sectional view showing a semiconductor structure after performing of step S101 in FIG. 1.

Referring particularly to FIGS. 1 and 2, in step S101, a dielectric layer 203 is formed on a surface S1 of a substrate 201. The substrate 201 includes a pattern-dense area 201*a* and a pattern-loose area 201*b* adjacent to the pattern-dense area 201*a*. The dielectric layer 203 covers both the pattern-dense area 201*a* and the pattern-loose area 201*b*. In FIG. 2, a dashed line indicates a boundary between the pattern-dense area 201*a* and the pattern-loose area 201*b*. The substrate 201 may be a conventional silicon substrate or other bulk substrate comprising a layer of semiconductive material. As used herein, the term "bulk substrate" means and includes not only silicon wafers, but also silicon-on-insulator substrates, such as silicon-on-sapphire substrates and silicon-on-glass substrates, epitaxial layers of silicon on a base semiconductor foundation, and other semiconductor or optoelectronic materials, such as silicon-germanium, germanium, gallium arsenide, gallium nitride and indium phosphide. In some embodiments of the present disclosure, the substrate 201 is a silicon substrate, a germanium substrate, a silicon germanium substrate, a silicon-on-sapphire substrate, a silicon-on-quartz substrate, a silicon-on-insulator substrate, an III-V compound semiconductor, or a combination thereof. Preferably, the substrate 201 is a silicon substrate.

Before forming the dielectric layer 203 on the surface S1 of the substrate 201, a pre-treating step including dehydration and baking can be performed to reduce or eliminate moisture on the surface S1 of the substrate 201. In the pre-treating step, a compound selected from a group consisting of hexa-methyl-disilazane (HMDS), tri-methyl-silyl-diethyl-amine (TMSDEA), and combinations thereof can be applied to the surface S1 of the substrate 201.

In step S101, the dielectric layer 203 is formed on the surface S1 of the substrate 201 using any conventional technology known in the field of semiconductor manufacturing, for example, spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), plasma-enhanced chemical vapor deposition (PECVD), or a combination thereof. Preferably, the dielectric layer 203 is formed on the surface S1 of the substrate 201 using ALD. The dielectric layer 203 can be made by any conventional materials known in the field of semiconductor manufacturing, for example, porous silica, siliconoxyfluoride, hydrogen silsesquioxane, methyl silsesquioxane, and combinations thereof. Preferably, the dielectric layer 203 is made of porous silica.

Figure 3:
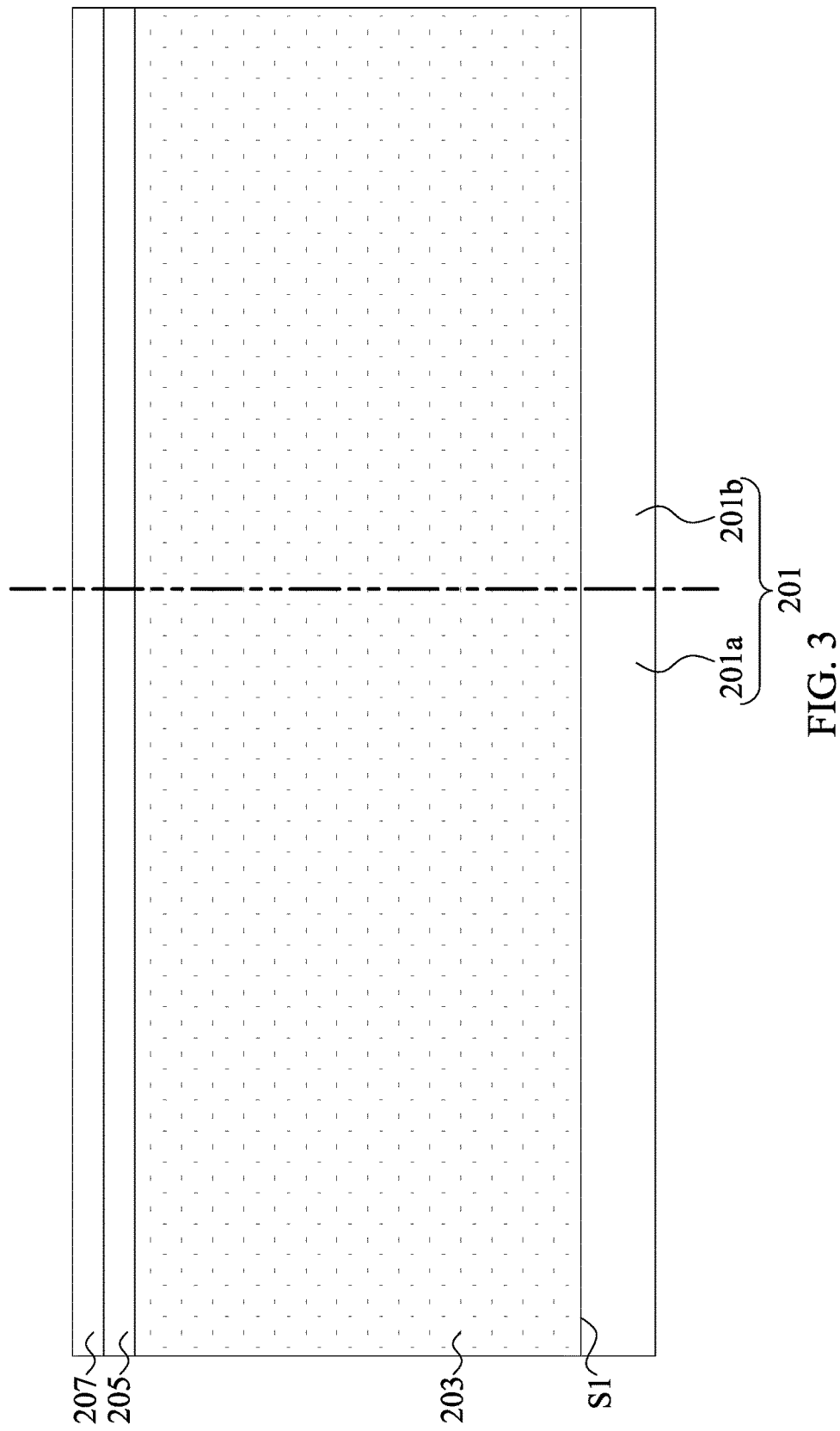
FIG. 3 is a cross-sectional view showing the semiconductor structure during an intermediate step of step S103 in FIG. 1.
Figure 4:
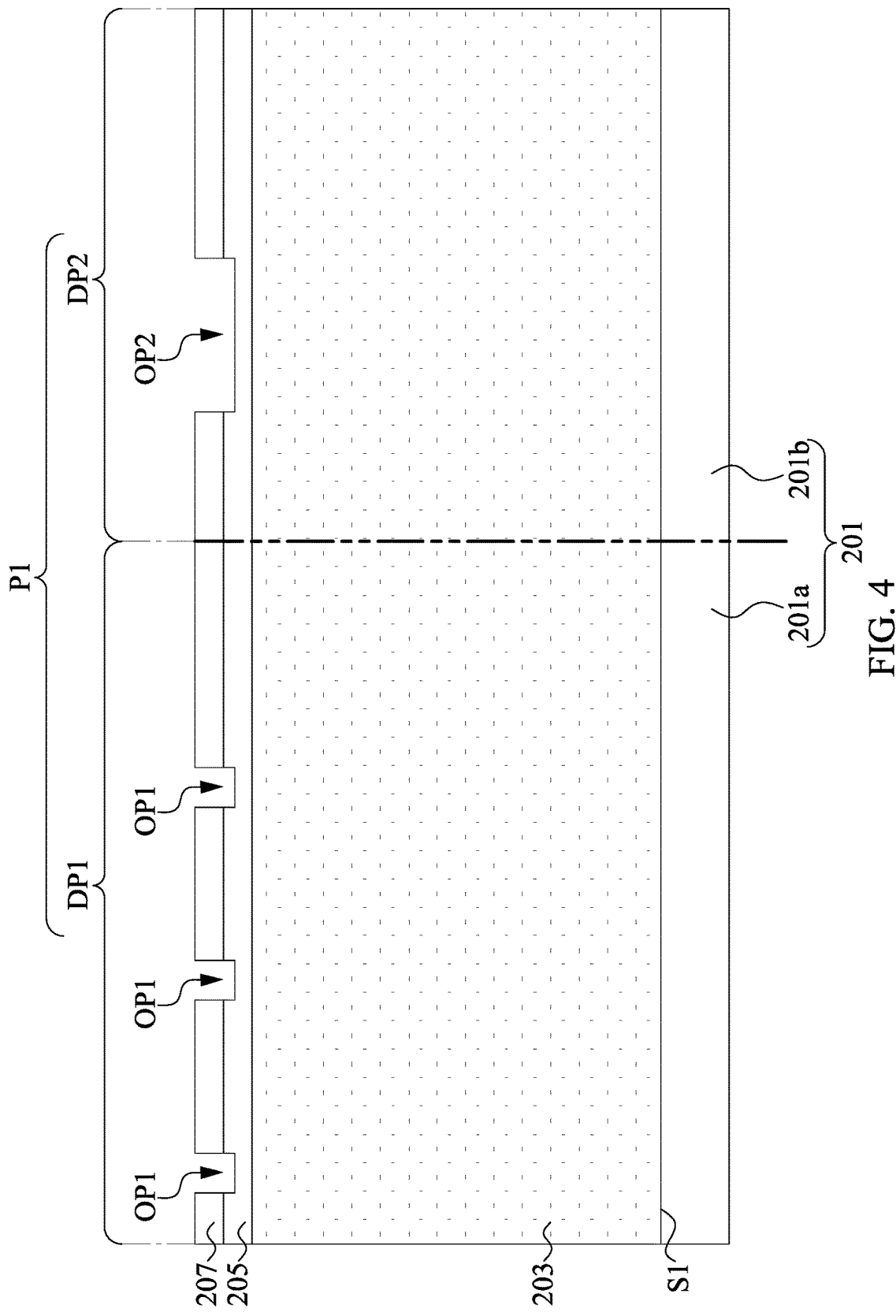
FIG. 4 is a cross-sectional view showing the semiconductor structure after performing of step S103 in FIG. 1.

Referring to FIGS. 1, 3 and 4, in step S103, a first hard mask pattern P1 is formed over the dielectric layer 203 to define a dense pattern DP1 in the dielectric layer 203 covering the pattern-dense area 201*a* and a loose pattern LP1 in the dielectric layer 203 covering the pattern-loose area 201*b*. By way of illustration, step S103 may be performed by sequentially depositing a first hard mask layer 205 and a first photoresist layer 207 on the dielectric layer 203, patterning the first photoresist layer 207, and etching the first photoresist layer 207 until a plurality of openings OP1 and OP2 are formed in the first hard mask layer 205 underlying the first photoresist layer 207. In some embodiments, the first hard mask layer 205 is formed of a material including nitride or silicon nitride. Methods of forming the first hard mask layer 205 include physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art. In the present disclosure, the first photoresist layer 207 is made of a positive-tone resist material, a negative-tone resist material, or a dual-tone resist material.

Figure 5:
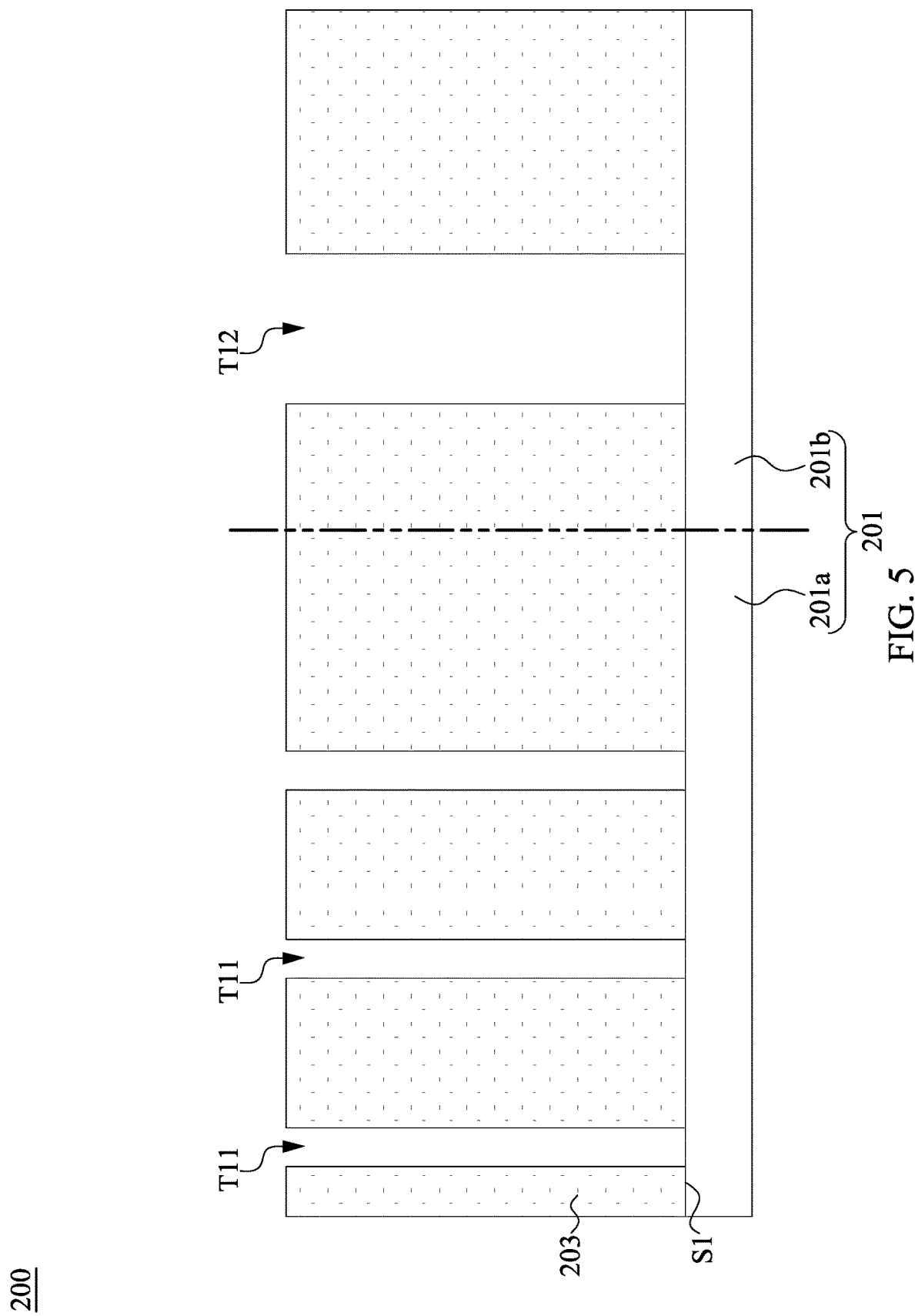
FIG. 5 is a cross-sectional view showing the semiconductor structure after performing of step S105 in FIG. 1.

Referring to FIGS. 1 and 5, in step S105, a first dielectric etching is carried out to form first metal line trenches T11 and T12 in the dielectric layer 203. Step S105 may be performed by etching the dielectric layer 203 using any conventional technology known in the field of semiconductor manufacturing. By way of illustration, step S105 can be carried out using gas/vapor dry etching, plasma-based dry etching, reactive ion etching (RIE), sputter dry etching, isotropic wet etching, or anisotropic wet etching. In a preferred embodiment of the present disclosure, step S105 is performed by etching the dielectric layer 203 using RIE.

Figure 6:
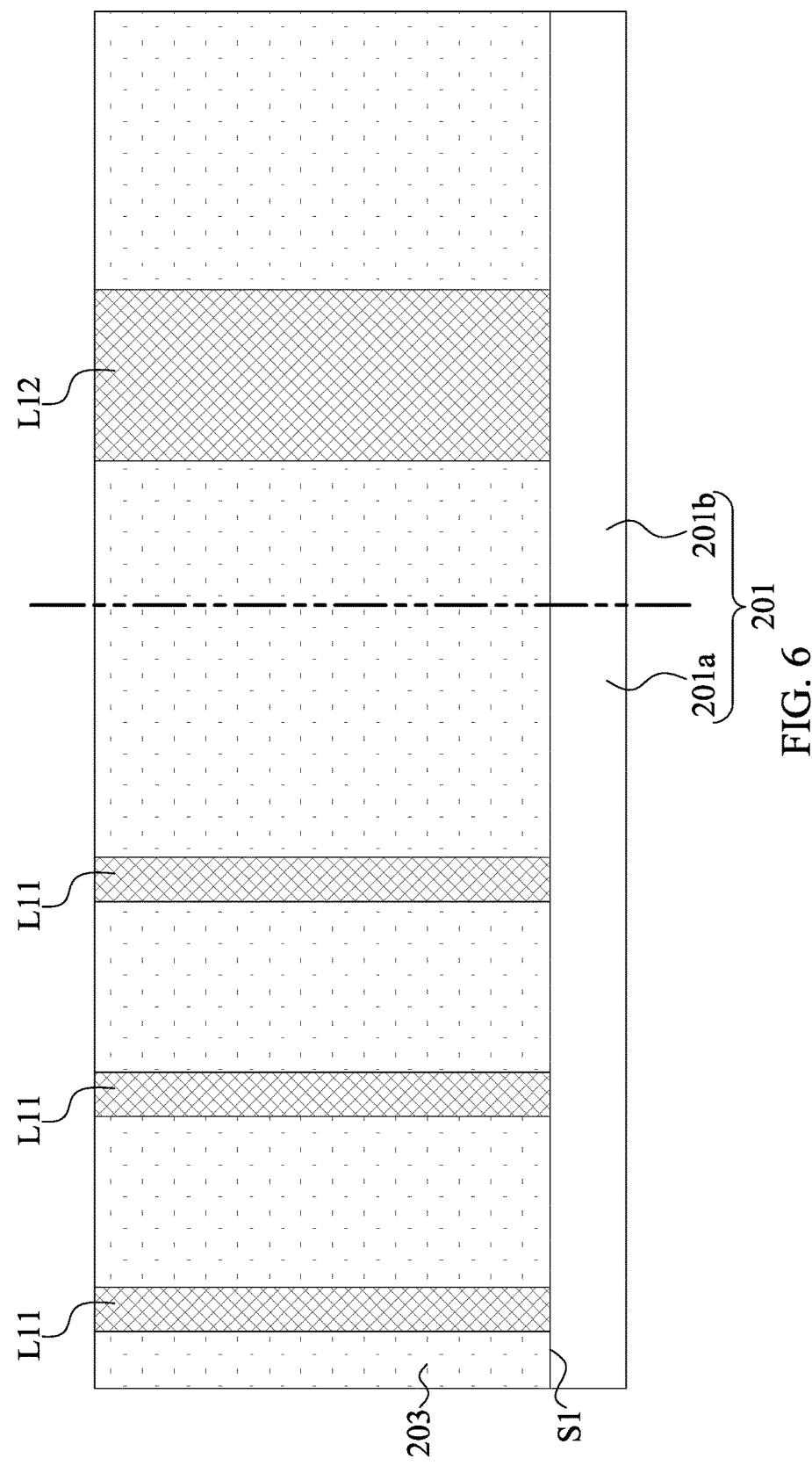
FIG. 6 is a cross-sectional view showing a pattern-dense area of the semiconductor structure after performing of step S107 in FIG. 1.

Referring to FIGS. 1 and 6, in step S107, the first metal line trenches T11 and T12 are filled with a first metal to form first metal lines L11 and L12 in the pattern-dense area and the pattern-loose area, respectively. The first metal can be selected from a group consisting of copper, aluminum, gold, silver, platinum, palladium, molybdenum, nickel, and combinations thereof. Step S107 may be performed using any conventional technology known in the field of semiconductor manufacturing. By way of illustration, step S107 can be carried out using spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), or a combination thereof. After the step of filling the first metal line trenches T11 and T12 with a first metal is completed, a chemical-mechanical polishing (CMP) is carried out to remove the first metal over the dielectric layer. Any conventional CMP methods can be used to perform the CMP in step S107. By way of illustration, the CMP can be performed using a CMP slurry comprising abrasive particles selected from a group consisting of silica, alumina, cesium oxide, and combinations thereof.

Figure 7:
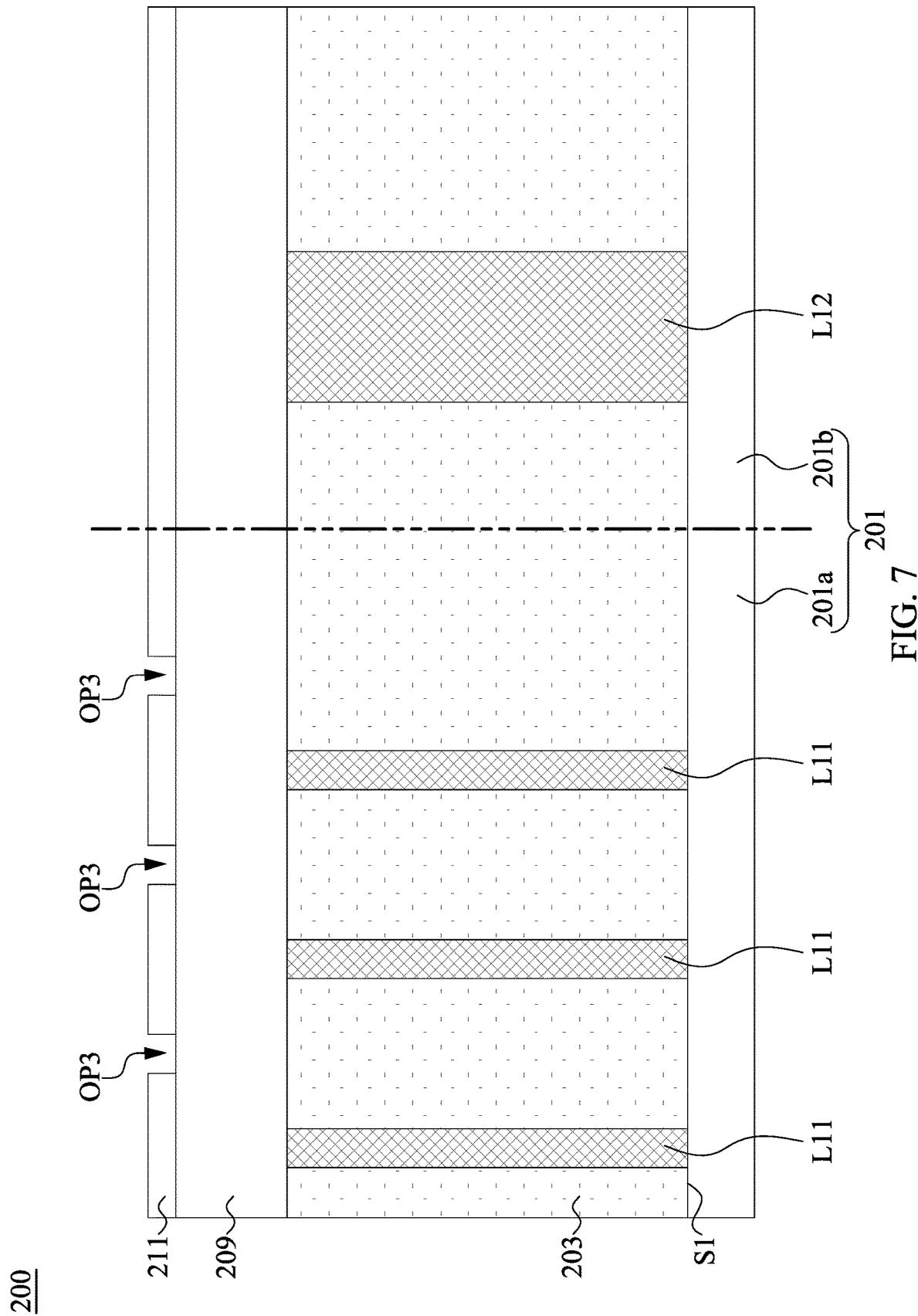
FIG. 7 is a cross-sectional view showing the semiconductor structure during an intermediate step of step S109 in FIG. 1.
Figure 8:
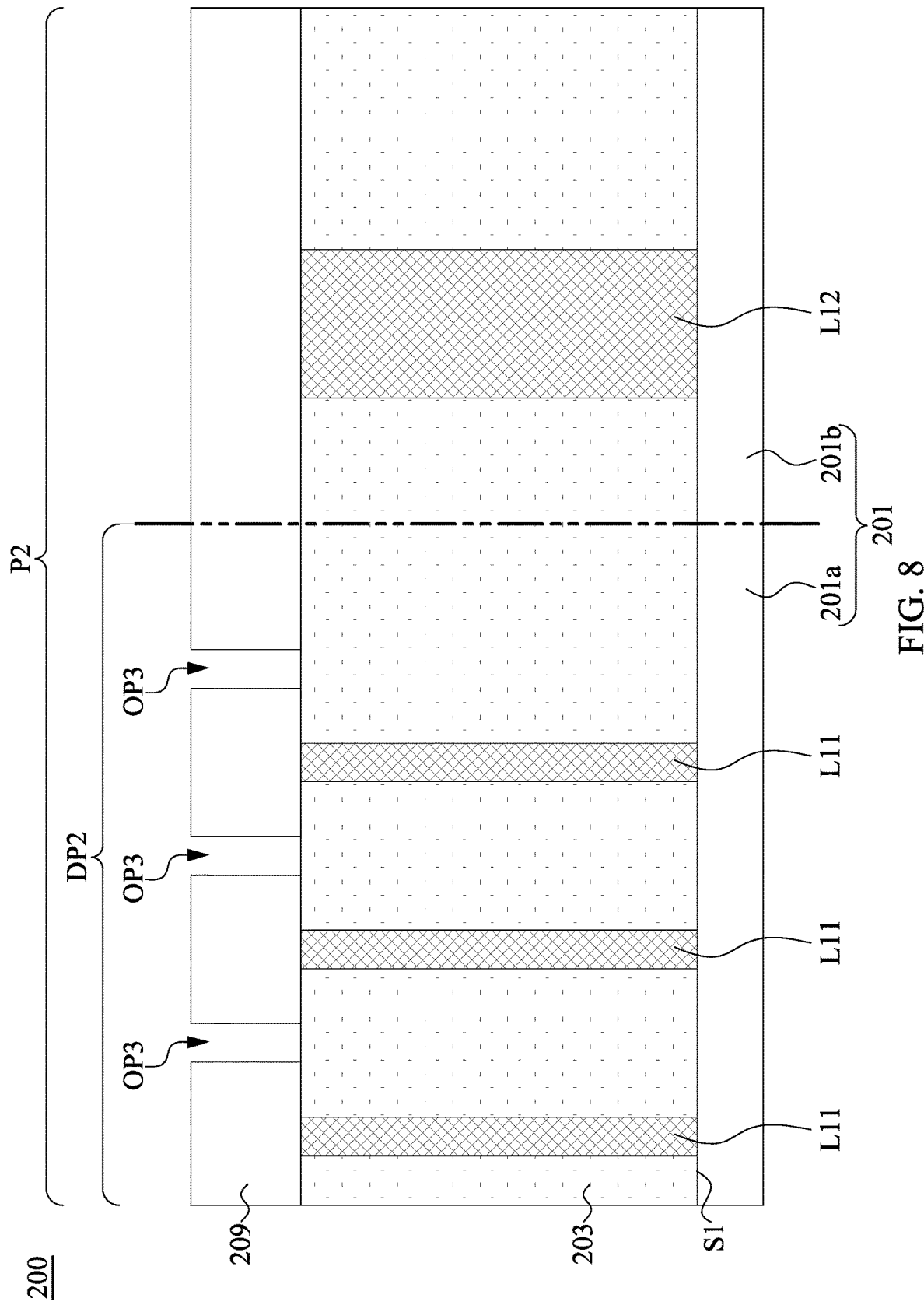
FIG. 8 is a cross-sectional view showing the semiconductor structure during an intermediate step of step S109 in FIG. 1.

Referring to FIGS. 1, 7 and 8, in step S109, a second hard mask pattern P2 is formed over the dielectric layer 203 to cover the first metal lines L11 and L12 in the pattern-dense area and the pattern-loose area. Another dense pattern DP2 is defined in the dielectric layer 203. By way of illustration, step S109 may be performed by sequentially depositing a second hard mask layer 209 and a second photoresist layer 211 on the dielectric layer 203, patterning the second photoresist layer 211, and etching the second photoresist layer 211 until a plurality of openings OP3 are formed in the second hard mask layer 209 underlying the second photoresist layer 211. The second hard mask layer 209 can be same as or different from the first hard mask layer 205. In some embodiments, the second hard mask layer 209 is formed of a material including nitride or silicon nitride. Methods of forming the second hard mask layer 209 include physical vapor deposition (PVD) processes, such as evaporation, RF or DC sputtering; chemical vapor deposition (CVD) processes such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art. In the present disclosure, the second photoresist layer 211 is made of a positive-tone resist material, a negative-tone resist material, or a dual-tone resist material.

Figure 9:
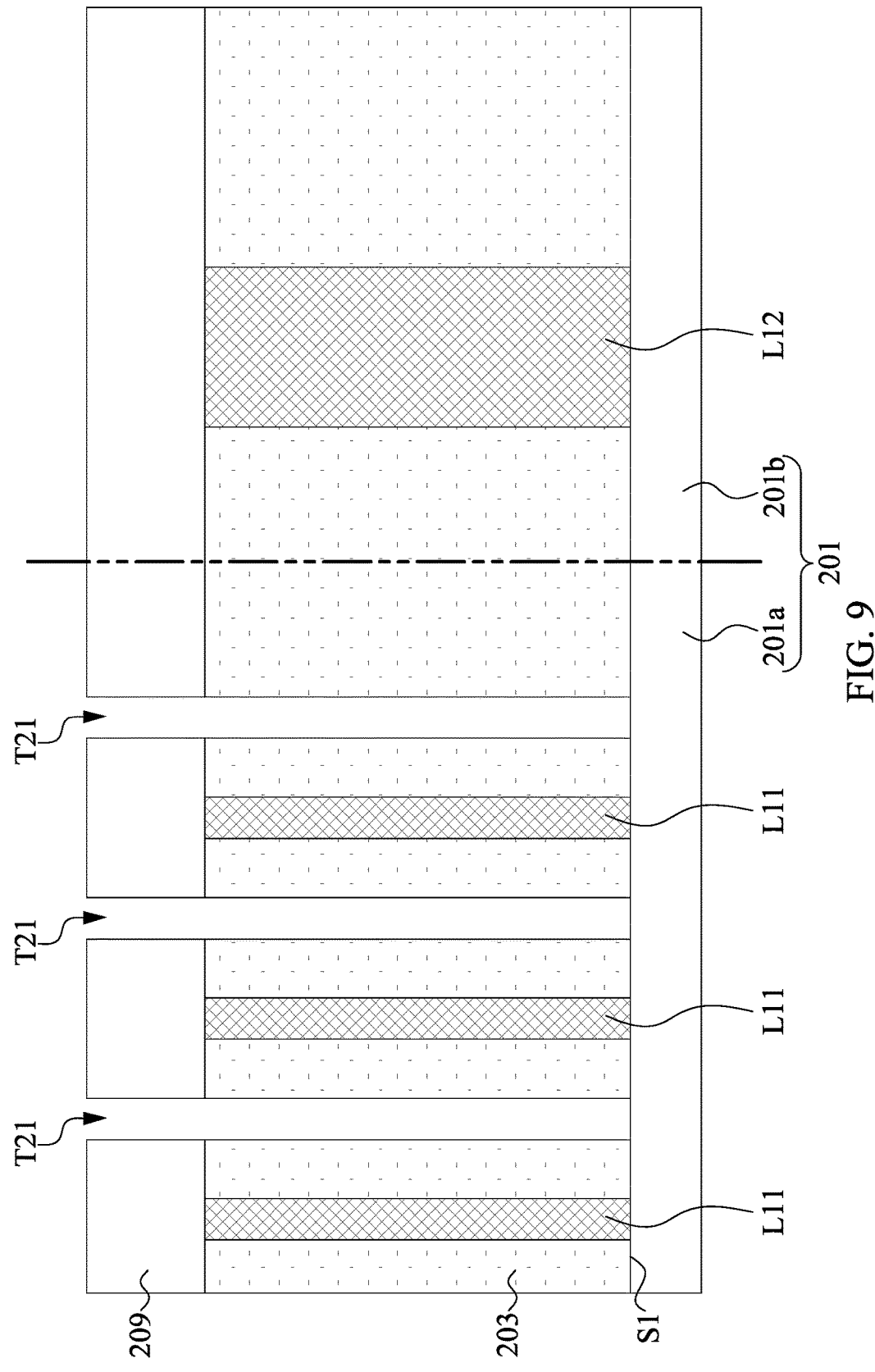
FIG. 9 is a cross-sectional view showing the semiconductor structure after performing of step S111 in FIG. 1.

Referring to FIGS. 1 and 9, in step S111, a second dielectric etching is carried out to form second metal line trenches T21 in the second hard mask layer 209. Step S111 may be performed by etching the second hard mask layer 209 using any conventional technology known in the field of semiconductor manufacturing. By way of illustration, step S111 can be carried out using gas/vapor dry etching, plasma-based dry etching, reactive ion etching (RIE), sputter dry etching, isotropic wet etching, or anisotropic wet etching. In a preferred embodiment of the present disclosure, step S111 is performed by etching the second hard mask layer 209 using RIE.

Figure 10:
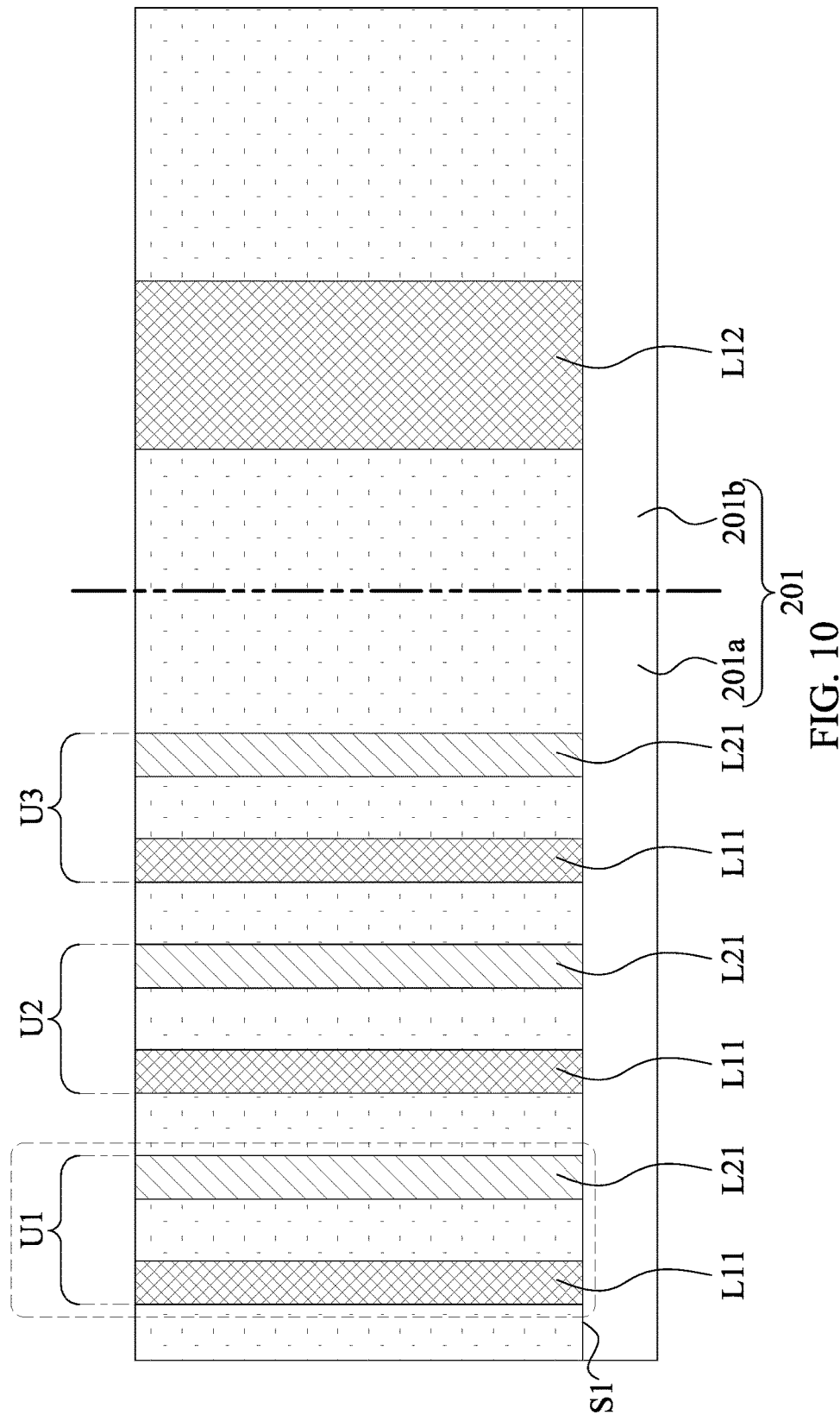
FIG. 10 is a cross-sectional view showing the semiconductor structure after performing of step S113 in FIG. 1.

Referring to FIGS. 1 and 10, in step S113, the second metal line trenches T21 are filled with a second metal to form second metal lines L21 in the pattern dense area. The second metal can be selected from a group consisting of copper, aluminum, gold, silver, platinum, palladium, molybdenum, nickel, and combinations thereof. Step S113 may be performed using any conventional technology known in the field of semiconductor manufacturing. By way of illustration, step S113 can be carried out using spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), or a combination thereof. After the step of filling the second metal line trenches T21 with a second metal is completed, a chemical-mechanical polishing (CMP) is carried out to remove the second metal over the dielectric layer. Any conventional CMP methods can be used to perform the CMP in step S113. By way of illustration, the CMP can be performed using a CMP slurry comprising abrasive particles selected from a group consisting of silica, alumina, cesium oxide, and combinations thereof.

As shown in FIG. 10, the metal lines L11 and L21 having high aspect ratios are formed in the pattern-dense area 201a. A pair of the metal line L11 and the metal line L21 comprise a semiconductor unit U1, U2 or U3. In some embodiments, the metal lines formed from the method of the present disclosure have an aspect ratio of 20:1 or greater, preferably between 20:1 and 60:1, and more preferably between 30:1 and 60:1.

Figure 11:
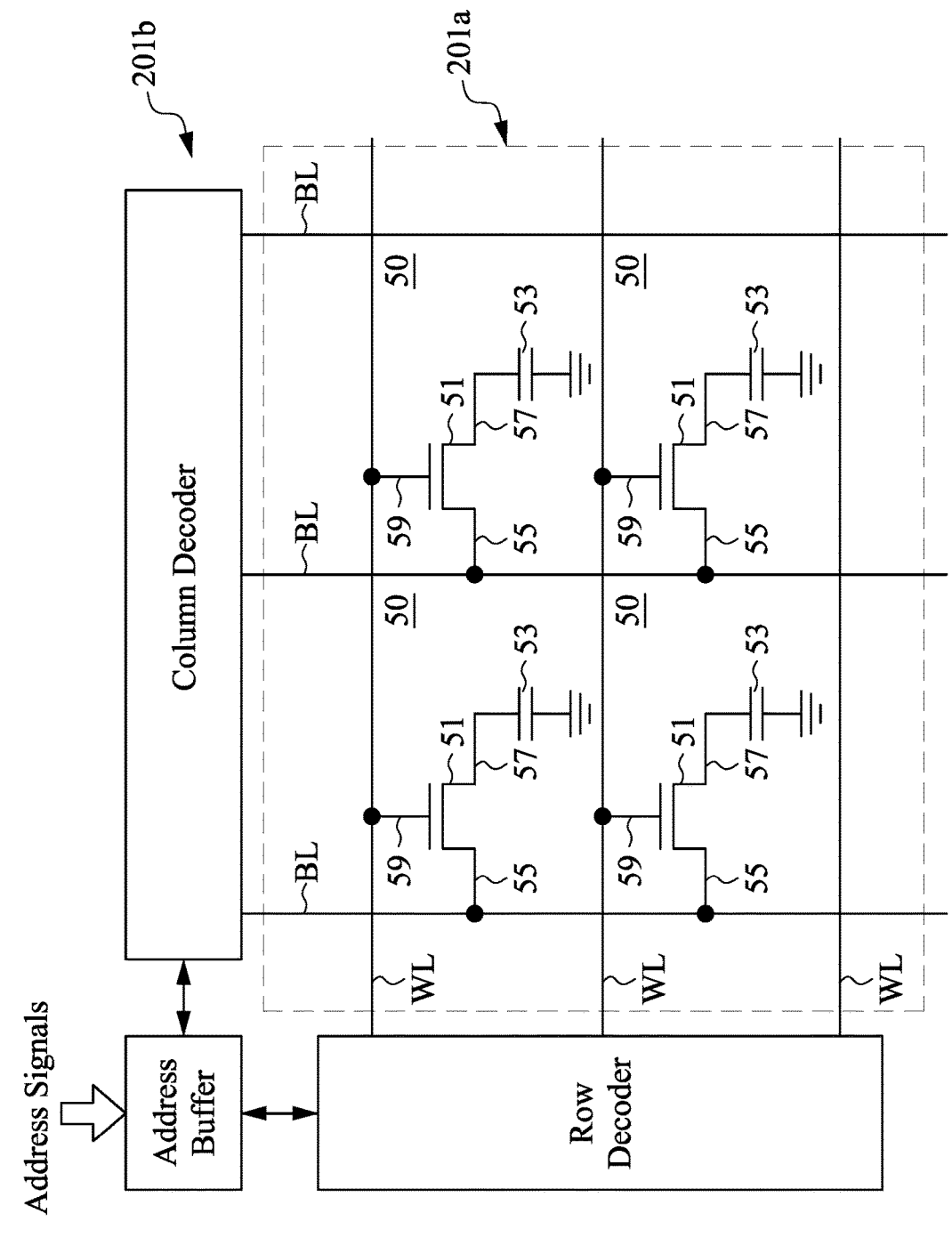
FIG. 11 is a partial schematic illustration of an exemplary integrated circuit in accordance with an embodiment of the present disclosure.

FIG. 11 is a partial schematic illustration of an exemplary integrated circuit, such as a memory device 300, including a pattern-dense area 201a and a pattern-loose area 201b in accordance with some embodiments of the present disclosure. In some embodiments, the memory device 300 includes a dynamic random access memory (DRAM). In some embodiments, the pattern-dense area 201a of the memory device 300 includes a number of memory cells 50 arranged in a grid pattern and including a number of rows and columns. The number of memory cells 50 in the pattern-dense area 201a may vary depending on system requirements and fabrication technology.

In some embodiments, each of the memory cells 50 in the pattern-dense area 201a includes an access device and a storage device. The access device is configured to provide controlled access to the storage device. In particular, the access device is a field effect transistor (FET) 51 and the storage device is a capacitor 53, in accordance with some embodiments of the present disclosure. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 51 such that the electrical charge can flow from the drain 55 to the capacitor 53. Therefore, the electrical charge stored in the capacitor 53 may be interpreted as a binary data value in the memory cell 50. For example, a positive charge above a threshold voltage stored in the capacitor 53 may be interpreted as binary "1." If the charge in the capacitor 53 is below the threshold value, a binary value of "0" is said to be stored in the memory cell 50.

The bit lines BL are configured to read and write data to and from the memory cells 50 in the array area A. The word lines WL are configured to activate the FET 51 to access a particular row of the memory cells 50 in the array area A. Accordingly, the memory device 300 also includes the pattern-loose area 201b which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Due to the design of the method of the present disclosure, which includes two photolithography stages, the first metal lines with high aspect ratio are formed in the dielectric layer, so that the dielectric layer provides mechanical support to the first metal lines with the high aspect ratio, thereby preventing the first metal lines with the high aspect ratio from collapsing or deforming. Because of a significant reduction or elimination of collapse or deformation phenomenon in the semiconductor structure, the problem associated with short circuits due to direct contact between the semiconductor components can be mitigated, and the reliability of semiconductor structures can be enhanced. As a result, the yield of the semiconductor structure is increased.

Although the present disclosure and its advantages have been described in detail, it should be understood that various changes, substitutions and alterations can be made herein without departing from the spirit and scope of the present disclosure as defined by the appended claims. For example, certain particular embodiments of the present disclosure may include the best mode known to the inventors for carrying out the invention. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for preparing fine metal lines with high aspect ratio, comprising:
    providing a substrate including a pattern-dense area and a pattern-loose area adjacent to the pattern-dense area with a dielectric layer covering the pattern-dense area and the pattern-loose area;
    pre-treating the substrate by dehydration and baking;
    forming a first hard mask pattern over the dielectric layer to define a dense pattern in the dielectric layer covering the pattern-dense area and a loose pattern in the dielectric layer covering the pattern-loose area;
    performing a first dielectric etching to form first metal line trenches in the dielectric layer;
    filling the first metal line trenches with a first metal to form first metal lines in the pattern dense area and the pattern loose area followed by performing a chemical-mechanical polishing (CMP) to remove the first metal over the dielectric layer;
    forming a second hard mask pattern over the dielectric layer to cover the first metal lines in the pattern dense area and the pattern loose area;
    performing a second dielectric etching to form a plurality of second metal line trenches alternating with the first metal lines in the pattern-dense area, wherein the second metal line trenches are only formed in the pattern-dense area; and
    filling the second metal line trenches with a second metal to form second metal lines followed by performing the chemical-mechanical polishing (CMP) to remove the second metal over the dielectric layer.

2. The method according to claim 1, wherein the substrate is a silicon substrate, a germanium substrate, a silicon germanium substrate, a silicon-on-sapphire substrate, a silicon-on-quartz substrate, a silicon-on-insulator substrate, a III-V compound semiconductor, or a combination thereof.

3. The method according to claim 1, wherein the step of providing a substrate including a pattern-dense area and a pattern-loose area adjacent to the pattern-dense area with a dielectric layer covering the pattern-dense area and the pattern-loose area is performed using spin-coating, sputtering, atomic layer deposition (ALD), atomic layer epitaxy (ALE), atomic layer chemical vapor deposition (ALCVD), low-pressure chemical vapor deposition (LPCVD), physical vapor deposition (PVD), or plasma enhanced chemical vapor deposition (PECVD), or a combination thereof.

4. The method according to claim 1, wherein the dielectric layer is made of a dielectric material selected from a group consisting of porous silica, siliconoxyfluoride, hydrogen silsesquioxane, methyl silsesquioxane, and combinations thereof.

5. The method according to claim 1, wherein the step of pre-treating the substrate is performed for reducing or eliminating moisture on a surface of the substrate.

6. The method according to claim 5, wherein a compound selected from a group consisting of hexa-methyl-disilazane (HMDS), tri-methyl-silyl-diethyl-amine (TMSDEA), and combinations thereof is applied to the surface of the substrate for carrying out the pre-treating.

7. The method according to claim 1, wherein the step of forming a first hard mask pattern over the dielectric layer to define a dense pattern in the dielectric layer covering the pattern-dense area and a loose pattern in the dielectric layer covering the pattern-loose area is performed by sequentially depositing a first hard mask layer and a first photoresist layer on the dielectric layer, patterning the first photoresist layer, and etching the first photoresist layer until an opening is formed in the first hard mask layer underlying the first photoresist layer.

8. The method according to claim 7, wherein the first photoresist layer is made of a positive-tone resist material, a negative-tone resist material, or a dual-tone resist material.

9. The method according to claim 1, wherein the step of performing a first dielectric etching to form first metal line trenches in the dielectric layer is performed by etching the dielectric layer using gas/vapor dry etching, plasma-based dry etching, reactive ion etching (RIE), sputter dry etching, isotropic wet etching, or anisotropic wet etching.

10. The method according to claim 1, wherein the step of performing a first dielectric etching to form first metal line trenches in the pattern-dense area is performed by etching the dielectric layer using RIE.

11. The method according to claim 1, wherein the step of filling the first metal line trenches with a first metal to form first metal lines in the pattern-dense area and the pattern-loose area is performed by depositing a first metal selected from a group consisting of copper, aluminum, gold, silver, platinum, palladium, molybdenum, nickel, and combinations thereof in the first metal line trenches.

12. The method according to claim 1, wherein the CMP is performed using a CMP slurry comprising abrasive particles selected from a group consisting of silica, alumina, cesium oxide, and combinations thereof.

13. The method according to claim 1, wherein the step of forming a second hard mask pattern over the dielectric layer to cover the first metal lines is performed by sequentially depositing a second hard mask layer and a second photoresist layer on the dielectric layer, patterning the second photoresist layer, and etching the second photoresist layer until an opening is formed in the second hard mask layer underlying the second photoresist layer.

14. The method according to claim 13, wherein the second photoresist layer is made of a positive-tone resist material, a negative-tone resist material, or a dual-tone resist material.

15. The method according to claim 1, wherein the step of performing a second dielectric etching to form second metal line trenches between the first metal lines in the pattern-dense area is performed by etching the dielectric layer using gas/vapor dry etching, plasma-based dry etching, reactive ion etching (RIE), sputter dry etching, isotropic wet etching, or anisotropic wet etching.

16. The method according to claim 1, wherein the step of performing a second dielectric etching to form second metal line trenches between the first metal lines in the pattern-dense area is performed using RIE.

17. The method according to claim 1, wherein the step of filling the second metal line trenches with a second metal is performed by depositing a second metal selected from a group consisting of copper, aluminum, gold, silver, platinum, palladium, molybdenum, nickel, and combinations thereof in the second metal line trenches.

18. The method according to claim 1, wherein the second metal is removed over the dielectric layer by the chemical-mechanical polishing (CMP) using a CMP slurry comprising abrasive particles selected from a group consisting of silica, alumina, cesium oxide, and combinations thereof.

19. The method according to claim 1, wherein the fine metal lines have a high aspect ratio between 20:1 and 60:1.

* * * * *